United States Patent [19]
Kelkar et al.

[11] Patent Number: 6,084,308
[45] Date of Patent: Jul. 4, 2000

[54] CHIP-ON-CHIP INTEGRATED CIRCUIT PACKAGE AND METHOD FOR MAKING THE SAME

[75] Inventors: Nikhil V. Kelkar, Santa Clara; William J. Schaefer, San Jose; John A. Jackson, Sunnyvale, all of Calif.

[73] Assignee: National Semiconductor Corporation, Santa Clara, Calif.

[21] Appl. No.: 09/107,801

[22] Filed: Jun. 30, 1998

[51] Int. Cl.⁷ .......................... H01L 23/48; H01L 23/52; H01L 29/40
[52] U.S. Cl. .......................... 257/777; 257/693; 257/787; 257/779
[58] Field of Search ...................... 257/777, 778, 257/693, 697, 787, 738, 779, 722; 228/128.22

[56] References Cited

U.S. PATENT DOCUMENTS

| | | | |
|---|---|---|---|
| 5,019,673 | 5/1991 | Juskey et al. | 174/52.2 |
| 5,352,926 | 10/1994 | Andrews | 257/717 |
| 5,579,208 | 11/1996 | Honda et al. | 361/813 |
| 5,608,262 | 3/1997 | Degani et al. | 257/723 |
| 5,723,369 | 3/1998 | Barber | 438/106 |
| 5,726,079 | 3/1998 | Johnson | 438/106 |
| 5,790,384 | 8/1998 | Ahmad et al. | 257/778 |
| 5,798,567 | 8/1998 | Kelly et al. | 257/723 |

FOREIGN PATENT DOCUMENTS 60-202956  10/1985  Japan ..................................... 257/722

*Primary Examiner*—David Hardy
*Assistant Examiner*—Jhihan B Clark
*Attorney, Agent, or Firm*—Beyer Weaver & Thomas, LLP

[57] ABSTRACT

A chip-on-chip integrated circuit package is disclosed. The device includes a substrate having a plurality of conductive landings disposed on a first surface thereof, a first die that is positioned over a substrate, and a second die that is mounted on the first die. The first die has a plurality of I/O pads that face away from the substrate. The second die includes a first set of contacts that mate with the conductive landings on the substrate and a second set of contacts that mate with the I/O pads on the first die. In a preferred embodiment, the first set of contacts on the second die take the form of a first set of solder bumps, and the second set of contacts on the second die take the form of a second set of solder bumps. The device may also include a die attach material for attaching the first die to the substrate, wherein the die attach material and the first and second sets of solder bumps have a configuration that facilitates bonding and at least a portion of each of the solder bumps in the first and second sets of solder bumps and the die attach material have a substantially common reflow temperature. A method for making a chip-on-chip integrated circuit package is also disclosed.

19 Claims, 6 Drawing Sheets

CHIP-ON-CHIP INTEGRATED CIRCUIT PACKAGE AND METHOD FOR MAKING THE SAME

CROSS REFERENCE TO RELATED APPLICATIONS

This application is related to commonly assigned U.S. patent application Ser. No. 08/517,603 (Attorney Docket No. NSC1P073) filed Aug. 22, 1995 entitled, "Thermally Enhanced Micro-Ball Grid Array Package" by Rajeev Joshi and to U.S. patent application Ser. No. 09/031,167 (Attorney Docket No. NSC1P106) filed Feb. 26, 1998 entitled "Surface Mount Die: Wafer level Chip-Scale Package and Process for Making the Same" by Schaefer, et al, having assignment rights in common with the present invention and which are herein incorporated by reference.

BACKGROUND OF THE INVENTION

1. Field of the Invention

The present invention relates generally to chip-on-chip integrated circuit (IC) packages. More particularly, the invention relates to chip-on-chip IC packages that are assembled and mounted onto a substrate having other components that are coupled through the substrate with the chip-on-chip IC package.

2. Description of the Related Art

In the field of integrated circuits, chip-on-chip packages are implemented within various electronic assemblies. The prominence of chip-on-chip packages is due, in part, to the relatively high degree of functionality provided by the chip-on-chip package. That is, two highly interdependent dies may be stacked together so that each die may quickly access information from the other die. For example, an application specific integrated circuit (ASIC) may require access to a dedicated analog-to-digital (A/D) converter. Thus, the ASIC and A/D converter may be stacked and packaged together such that the A/D converter's input and output (I/O) pads are directly coupled to the ASIC's I/O pads. This stacked arrangement allows the ASIC to quickly use the A/D converter's capabilities and convert analog signals to digital signals while reducing some of the problems associated with long interconnect wires between non-stacked devices, such as signal interference and degradation.

Additionally, conventional chip-on-chip packages typically occupy a relatively small footprint within the completed electronic assembly. That is, conventional chip-on-chip packages take up less surface area on the substrate than two separately packaged dies that are coupled together. This feature represents a significant advance towards the continuing goal of miniaturization of electronic assemblies.

FIG. 1 is a side view of a conventional chip-on-chip package 100. As shown, the chip-on-chip package 100 typically includes a first die 104, a second die 102, a substrate 114, a first plurality of bonding wires 108 that couple the first die 104 to the substrate 114, and a second plurality of bonding wires 106a and 106b that couple the first die 104 to the second die 102. A first die attach layer 112 is typically configured to attach the first die 104 to the substrate 114, and a second die attach layer 110 is configured to attach the second die 102 to the first die 104. Typically, the first die 104 has a nonactive portion (not shown) for mounting the second die 102 thereon.

The first plurality of bonding wires 108a and 108b couple conductive pads (not shown) of the first die 104 to conductive pads or traces (not shown) of the substrate 114, and the second plurality of bonding wires 106 couple conductive pads (not shown) of the second die 102 to conductive pads (not shown) of the first die 104.

Chip-on-chip packages are constructed and packaged using conventional packaging and assembly techniques. Initially, the first and second die are fabricated using conventional semiconductor processes. The first and second die will each include a plurality of conductive pads disposed on one surface. The first die 104 is then attached to the substrate 114 using the first die attach layer 112. The second die 102 is then attached to the first die 104 using the second die attach layer 110. Conductive pads of the first die 104 are then coupled to the substrate 114 using conventional wire bonding techniques. Likewise, conductive pads of the second die 102 are then coupled to conductive pads of the first die 104 using conventional wire bonding techniques. After the dies are coupled together and to the substrate, an encapsulation material 116 is then added to protect the bonding wires and dies from mechanical and electrical damage.

Although conventional chip-on-chip packages provide a means for reducing overall size of electronic assemblies, there are several disadvantages associated with conventional chip-on-chip packages. For example, bonding wires of conventionally assembled chip-on-chip packages have an associated conductance and capacitance that may be significant and may result in a reduction of reliability in certain high-speed applications. That is, wire bond interconnections provide limited electrical performance compared to several other interconnect types, such as flip chip interconnects. Additionally, bonding wires are associated with a decrease in the overall reliability of the chip-on-chip package. During the encapsulation process, the bonding wires may be displaced and result in an increase in the number of shorts within the chip-on-chip package. By way of another example, the assembly process for conventional chip-on-chip packages is relatively complex and expensive. By way of another example, the delicate bonding wires of conventional chip-on-chip packages require encapsulation material to protect them from stresses, and, thus, the overall size of the conventional chip-on-chip package is increased accordingly by the amount of encapsulation material that is used. Additionally, conventional chip-on-chip packages using wire bond processes have limited product throughput that is dependent on throughput of the underlying wire bond and mold processes.

In light of the above disadvantages of conventional chip-on-chip packages, there is still a need for an improved chip-on-chip package that has a relatively small overall package size and high reliability. Additionally, there is a need for a simplified method for making such an improved package and mounting such a package onto a substrate.

SUMMARY OF THE INVENTION

Accordingly, the present invention provides an improved chip-on-chip package and method for making the same.

In one aspect of the invention, a chip-on-chip integrated circuit package is disclosed. The device includes a substrate having a plurality of conductive landings disposed on a first surface thereof, a first die that is positioned over the substrate, and a second die that is mounted on the first die. The first die has a plurality of I/O pads that face away from the substrate. The second die includes a first set of contacts that mate with the conductive landings on the substrate and a second set of contacts that mate with the I/O pads on the first die. In a preferred embodiment, the first set of contacts of the second die take the form of solder bumps, and the second set of contacts of the second die take the form of solder bumps.

In another aspect, the chip-on-chip integrated circuit package includes a substrate, a first die attached to the first surface of the substrate by a die attach material, and a second die that is mounted on the first die. The substrate has first and second surfaces, a plurality of conductive landings disposed on the first surface, and a plurality of substrate contacts on the second surface. The first die has a plurality of I/O pads that face away from the substrate. The second die includes a first set of solder bumps that mate with the conductive landings on the substrate and a second set of solder bumps that mate with the I/O pads on the first die. The die attach material and at least a portion of the first set of solder bumps have substantially a same reflow temperature.

In an alternative embodiment of the present invention, a method of constructing a chip-on-chip package that includes a first die having a plurality of I/O pads and a second die having first and second sets of contacts on a first surface of the second die is disclosed. The first die is positioned over a substrate such that the plurality of I/O pads on the first die face away from the substrate. The second die is attached to the substrate and the first die such that the first set of contacts mate with conductive landings on the substrate and the second set of contacts mate with the I/O pads on the first die. In a preferred embodiment, a die attach material is used to attach the first die to the substrate, and the die attach material has a first portion that reflows at a substantially same temperature as a second portion of the first set of contacts, and the method further includes substantially simultaneously reflowing the first and second portions such that the first die adheres to the substrate and the first set of contacts of the second die adhere to the substrate in a single reflow process. In another embodiment, the die attach material of the first die is configured to facilitate self-alignment of the second die with respect to the first die and substrate during the reflow process. In another aspect, the second die is attached by a flip chip assembly process.

The present inventions have many advantages. For example, when a common reflow temperature is used for the interconnect joints (e.g., contact sets) of the chip-on-chip package, these interconnects allow for a significantly higher throughput than convention chip-on-chip packages that implement bonding wire interconnects. That is, a large number of interconnect joints may be formed simultaneously in a single reflow process, rather than in multiple reflow processes to form multiple bonding wires as required by conventional chip-on-chip packages. Additionally, the chip-on-chip package of the present invention has a relatively small package size when the contacts (interconnects) are in the form of bumps, as compared with using conventional bonding wires.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Reference will now be made in detail to the preferred embodiment of the invention. An example of the preferred embodiment is illustrated in the accompanying drawings. While the invention will be described in conjunction with that preferred embodiment, it will be understood that it is not intended to limit the invention to one preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
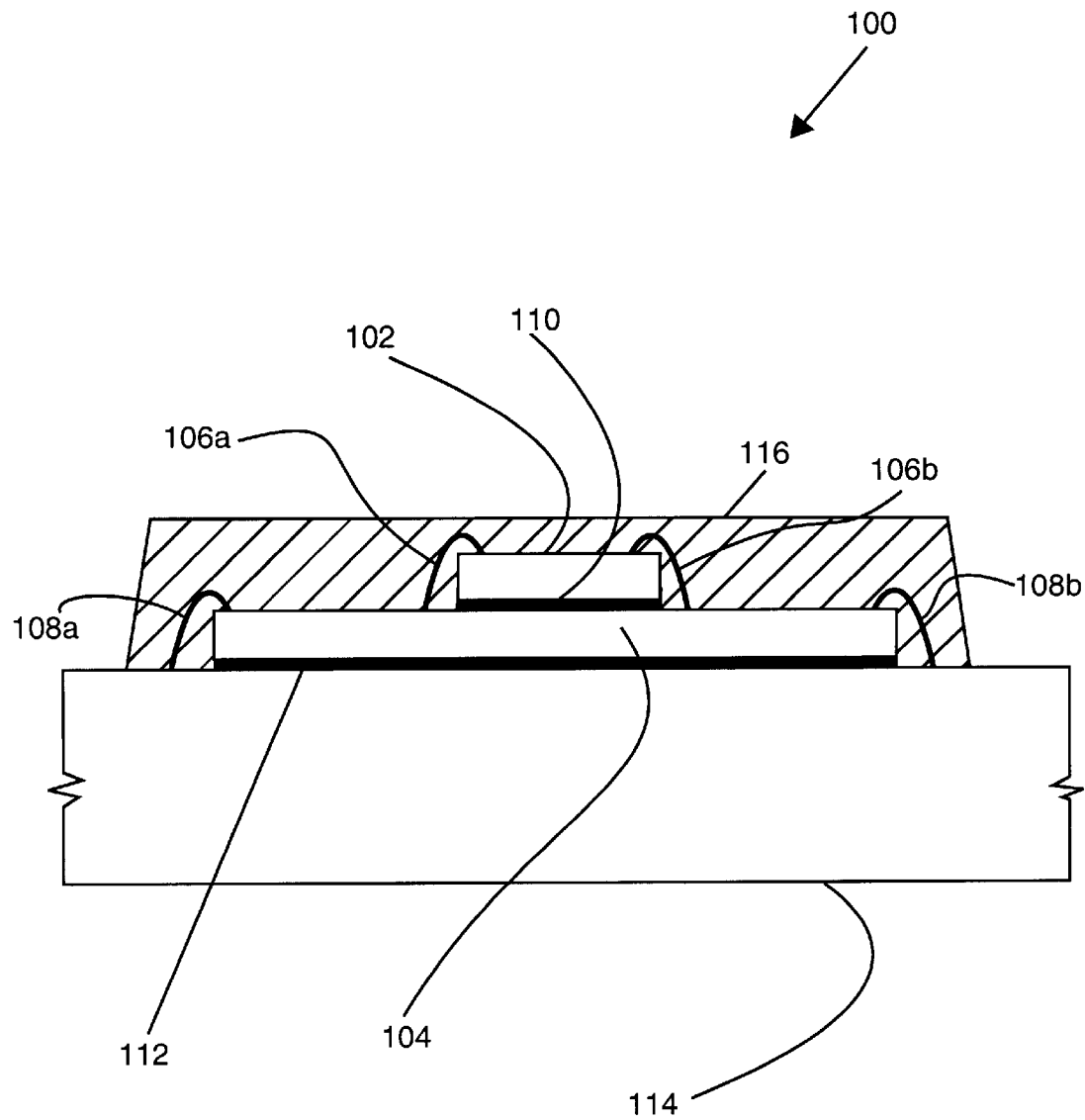
FIG. 1 is a side view of a conventional chip-on-chip package.
Figure 2:
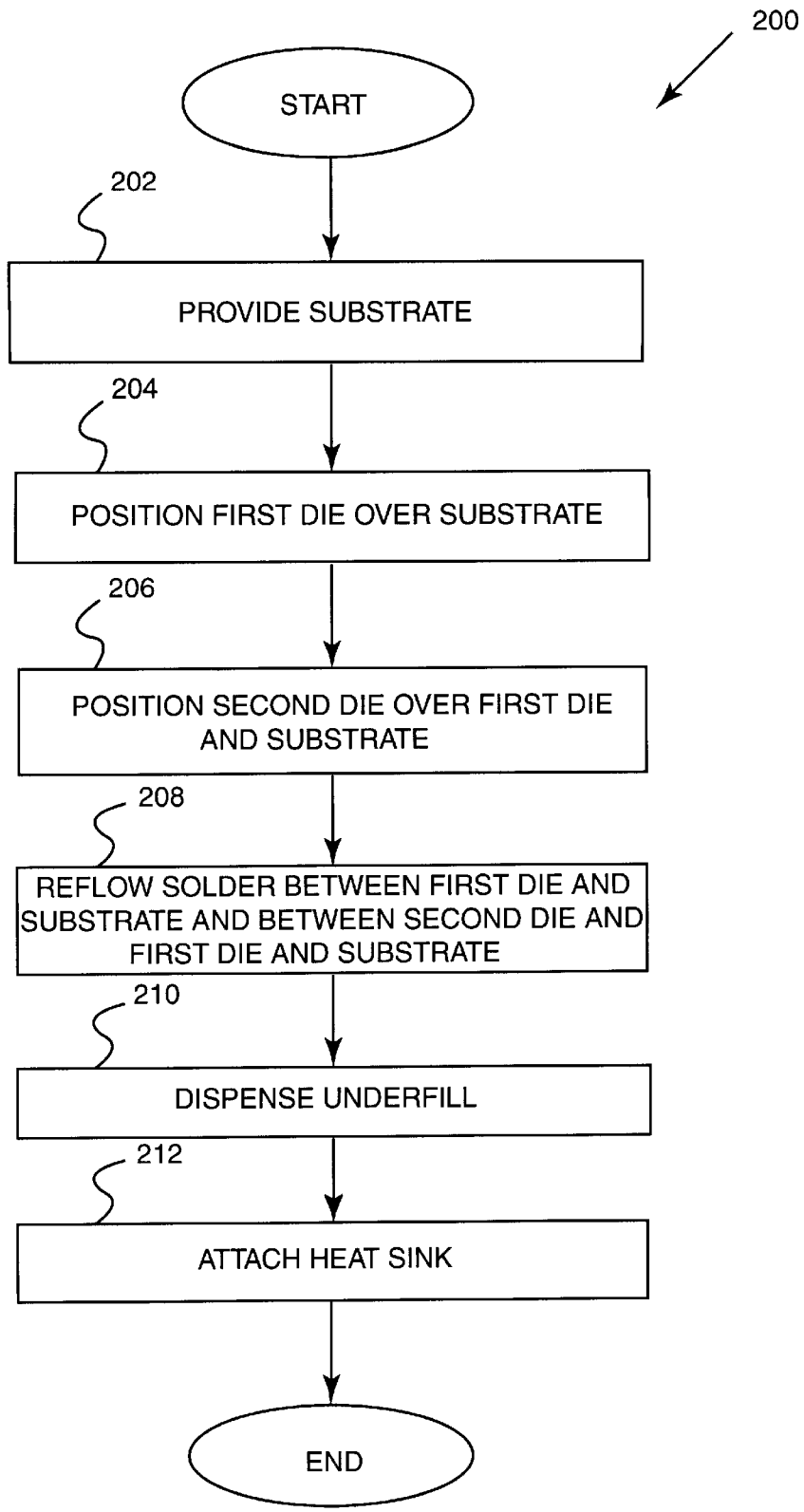
FIG. 2 is a flow chart illustrating a process of fabricating a chip-on-chip integrated circuit (IC) package in accordance with one embodiment of the present invention.

FIG. 2 is a flow chart illustrating a process 200 of fabricating a chip-on-chip integrated circuit (IC) package in accordance with one embodiment of the present invention. FIGS. 3A through 3D are diagrammatic side view perspectives of the constructed chip-on-chip IC package after completion of various operations of process 200.

Figure 3A:
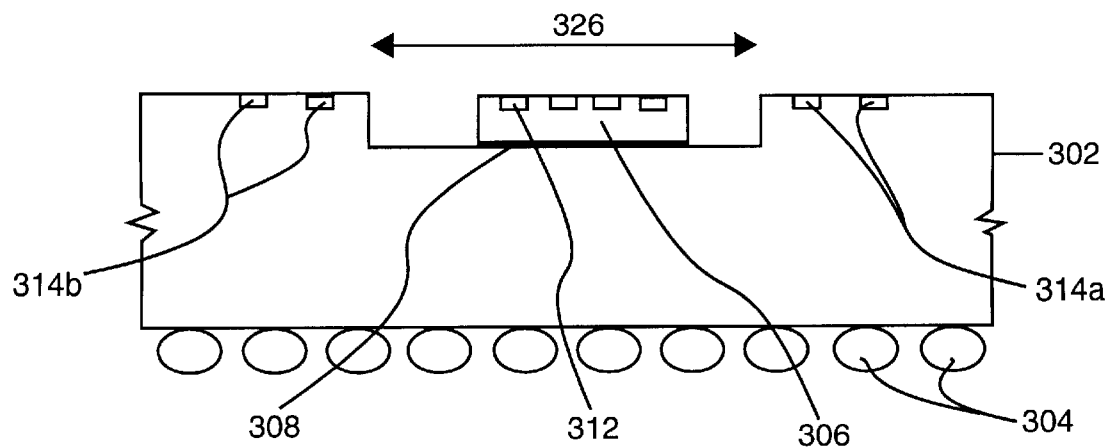
FIGS. 3A through 3D illustrate various cross sectional views of various stages during the process of constructing a chip-on-chip IC package in accordance with one embodiment of the present invention.
Figure 3B:
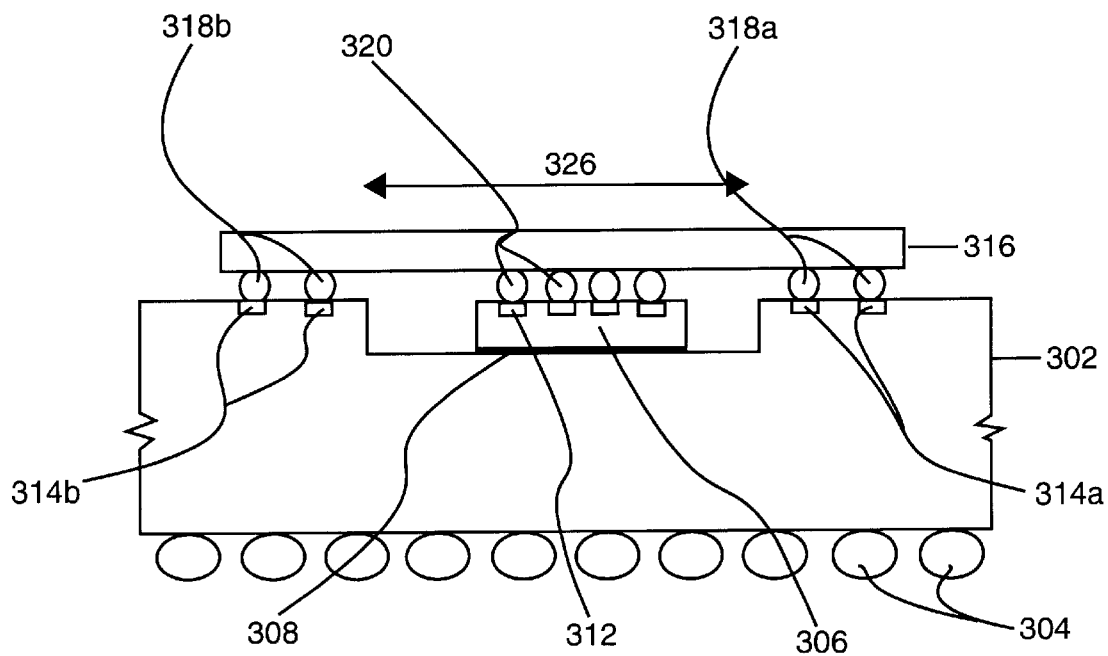
Figure 3C:
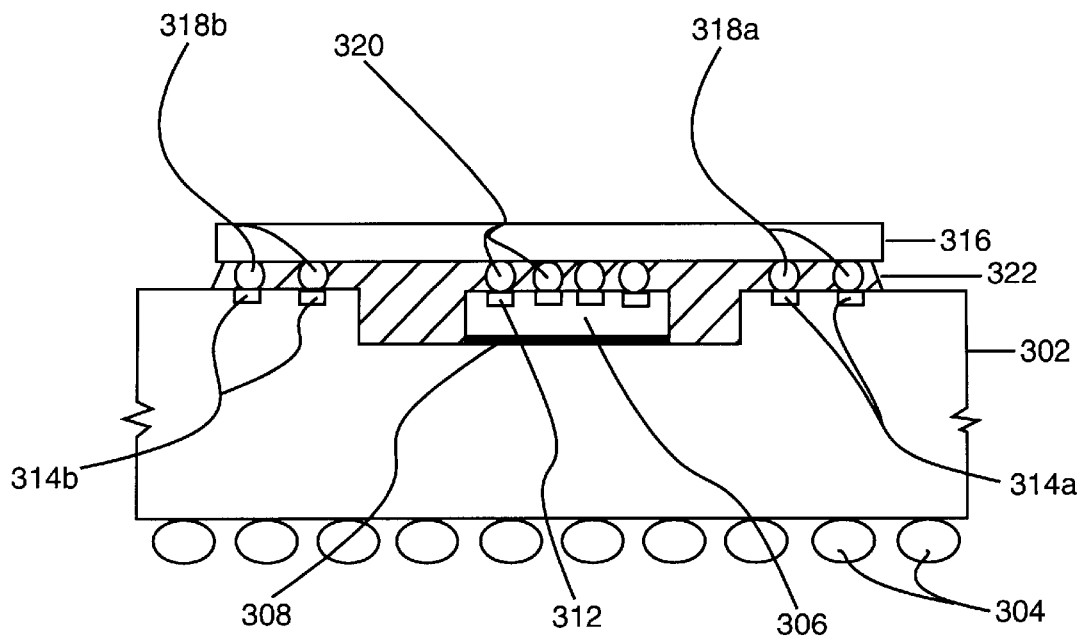
Figure 3D:
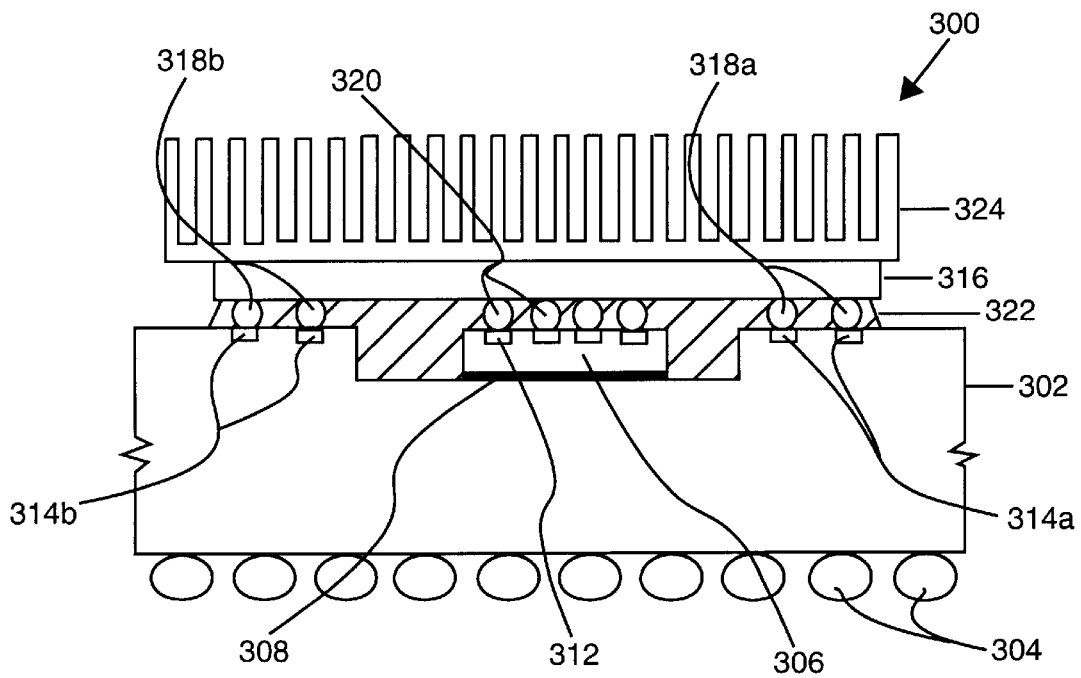

Turning first to FIG. 3D, a completed chip-on-chip package 300 will be described. As shown, the chip-on-chip package 300 includes a substrate 302, a first die 306, and a second die 316. The first die 306 is coupled to the substrate 302 by a die attach material 308. The second die 316 is coupled to the substrate 302 by a first set of contacts 318a and 318b. The second die 316 is also coupled to the first die 306 by a second set of contacts 320. Each one of the first set of contacts 318a and 318b. adhere to an associated one of a plurality conductive landings 314a and 314b on the substrate 302. Each one of the second set of contacts 320 adhere to an associated one of a plurality of I/O pads 312 on the first die 306.

The chip-on-chip package 300 may also include other packaging components. For example, the package may include an underfill layer 322 to increase the durability and reliability of the chip-on-chip package 300, a heat sink 324 that is attached to the back surface of the second die 316, and/or an encapsulation material (not shown) to protect the stacked dies. By way of another example, the substrate 302 may include a plurality of substrate contact bumps 304 or pins (not shown) for attaching the substrate 302 to an external printed circuit board (PCB) (not shown).

FIGS. 3A through 3D will now be described concurrently with FIG. 2 to better illustrate the operations of FIG. 2. FIG. 3A illustrates a cross-section view of the first die 306 attached to the substrate 302 with the die attach material 308 in accordance with one embodiment of the present invention.

Initially, in operation 202 a substrate 302 is provided as shown in FIG. 3A. The substrate 302 may take any suitable form for distributing the signals from the second die 316 or the first die 306 to other components that are positioned on either the substrate or another external substrate or PCB. For example, the substrate 302 may be in the form of a ball grid array substrate, as shown. By way of other examples, the substrate may be in the form of a pin grid array device or a land grid array device.

As shown, the substrate 302 may have a plurality of substrate contacts 304. The substrate contacts 304 may be in any suitable form, such as bumps, pins, or conductive landing pads. The substrate contacts 304 may be coupled through the substrate 302 to one or more of the conductive landings 314a and 314b disposed on the top surface of the substrate 302 and to traces of an external PCB (not shown). Thus, the conductive landings 314a and 314b of the substrate 302 may be either coupled with other components on the substrate 302, itself, or to other components on an external PCB. Of course, the external PCB is optional, and the substrate 302 may be in the form of a stand-alone PCB having a plurality of components mounted thereon.

In operation 204, a first die 306 is positioned over a substrate 302 as shown in FIG. 3A. The substrate 302 may include a cavity 326 for receiving the first die 306. However, a cavity 326 may not be required if, for example, the first set of contacts 318a and 318b are larger than the second set of contacts 320 such that second die 316 may be attached to the first die 306 and substrate 302. The first die 306 may be positioned over the substrate 302 using any suitable conventional die attach material 308 that will facilitate attachment of the first die 306 to the substrate. By way of example, the die attach material 308 may be in the form of a solder material. When a solder material is used, the first die 306 will typically include a metallic coating (not shown) on a back surface that serves as a bonding surface for the die attach material 308 so as to provide a bonding surface for the die attach material 308. A preferred configuration for the die attach material 308 will be described below, wherein the die attach material 308 has a melting point substantially equal to a melting point of the first and second set of contacts (318a and 318b and 320) of the second die 316.

After the first die 306 is positioned over the substrate 302, the second die 316 is positioned over the first die 306 as well as the substrate 302 in operation 206. FIG. 3B illustrates a cross-section view of the second die 316 positioned over the first die 306 and the substrate 302 in accordance with one embodiment of the present invention. As shown, the second die is in the form of a bumped type die, such as a flip chip device. In a preferred embodiment, a portion of the bumps of the second die 316 has a same reflow temperature as a portion of the die attach material. This embodiment is further described below.

Although the present invention is described as implementing a bumped second die (e.g., a flip chip type die) that is stacked directly onto the conductive landings of a second non-bumped die, of course, it should be well understood to those skilled in the art that the present invention is not limited to this particular configuration. For example, a surface mount type second die may be coupled directly with the first die. A particular surface mount package is described in U.S. patent application Ser. No. 09/031,167 (Attorney Docket No. NSC1P106) filed Feb. 26, 1998 entitled "Surface Mount Die: Wafer level Chip-Scale Package and Process for Making the Same" by Schaefer, et al, having assignment rights in common with the present invention and which is herein incorporated by reference.

By way of another example, a ball grid array device may be implemented for one of the stacked dies. A particular ball grid array device is described in U.S. patent application Ser. No. 08/517,603 (Attorney Docket No. NSC1P073) filed Aug. 22, 1995 entitled, "Thermally Enhanced Micro-Ball Grid Array Package" by Rajeev Joshi having assignment rights in common with the present invention and which is herein incorporated by reference. By way of another example, a pin grid array device or land grid array device may be implemented for one of the stacked dies.

After the second die 316 is positioned over the first die 306 in operation 206, a reflow process is implemented in operation 208. The reflow process simultaneously adheres the second die 316 to the substrate 302 and first die 306 and adheres the first die 306 to the substrate 302. Preferably, at least a portion from each of the first set of contacts 318a and 318b, second set of contacts 320, and die attach material 308 will melt and bond to the surface of their respective structures (e.g., first die, second die, and/or substrate) when one temperature is applied during the reflow process in operation 208.

A common reflow temperature of the die attach material and first and second sets of contacts allows self-alignment of the first die with the second die and that of the second die with the substrate. Reflow of the contacts between the second die and substrate and of the die attach material self-aligns the whole assembly. Self-alignment is further described below.

Next, in operation 210 an underfill layer 322 is dispensed between the second die 316 and the first die 306, between the second die 316 and the substrate 302, and around the first and second set of contacts of the second die 316. FIG. 3C illustrates a cross-section view of the second die 316 attached to the first die 306 and to the substrate 302 with an injected underfill layer 322 in accordance with one embodiment of the present invention. Although an underfill layer 322 is preferred since the underfill layer increases the reliability of the chip-on-chip package 300, the underfill layer is not required. For example, if the second die 316 is in the form of a surface mount device, as described in U.S. Pat. No. 09/031,167 (Attorney Docket No. NSC1P106), the underfill layer is not required since the device is sufficiently reliable without an underfill layer.

After the underfill layer 322 is deposited, a heat sink 324 may be attached to the bottom surface of a second die 316. FIG. 3D illustrates a cross-section view of the second die 316 attached to the first die 306 and to the substrate 302 with a heat sink 324 attached above the second die 316 in accordance with one embodiment of the present invention. The heat sink 324 provides a thermal path for heat dissipation from the second die 316.

As discussed above, the first and second set of contacts 320 and die attach material have portions that are preferably formed from a solder material that have a common reflow temperature. Most preferably, the solder material is a eutectic type solder material, or a eutectic-tipped solder material (a cap of eutectic material formed over a high lead type solder material), which eutectic type solder reflows at a relatively low temperature.

The die attach material 308 between the first die 306 and substrate 302 and metallic coating of the first die 306 may also be configured to promote self-alignment of the second die 316 with respect to the first die 306 and substrate 302. During reflow, the first set of contacts 318a and 318b of the second die 316 will melt and be attracted to the conductive landings 314a and 314b of the substrate 302. Likewise, the second set of contacts 320 will melt and be attracted to the I/O pads 312 of the first die 306. Finally, the die attach material 308 will melt and be attracted to the metallic coating (not shown) on the back surface of the first die 306. In sum, the first and second set of contacts will move back and forth to self-align and mate with corresponding conductive landings 314a and 314b on the substrate 302 and the I/O pads 312 of the first die 306, while the die attach material 308 will move back and forth to allow accurate alignment of the first die 306 relative to the second die 316 while preserving accuracy of alignment between the second die 316 and the substrate 302.

To promote self-alignment of the second die 316 with respect to the first die and substrate, it is preferable that the first and second set of contacts are more strongly attracted to corresponding bonding surfaces (e.g., conductive landings of the substrate and I/O pads of the first die) than the die attach material 308 is attracted to the metallic coating of the first die 306. Thus, to achieve this result, as described above, it is preferable that the die attach material 308 has a portion that reflows at a same temperature as portions of the first and second contacts. Additionally, it is preferred that the portion of die attach material have an amount that is less than the combined portions of the first and second contacts.

Figure 4A:
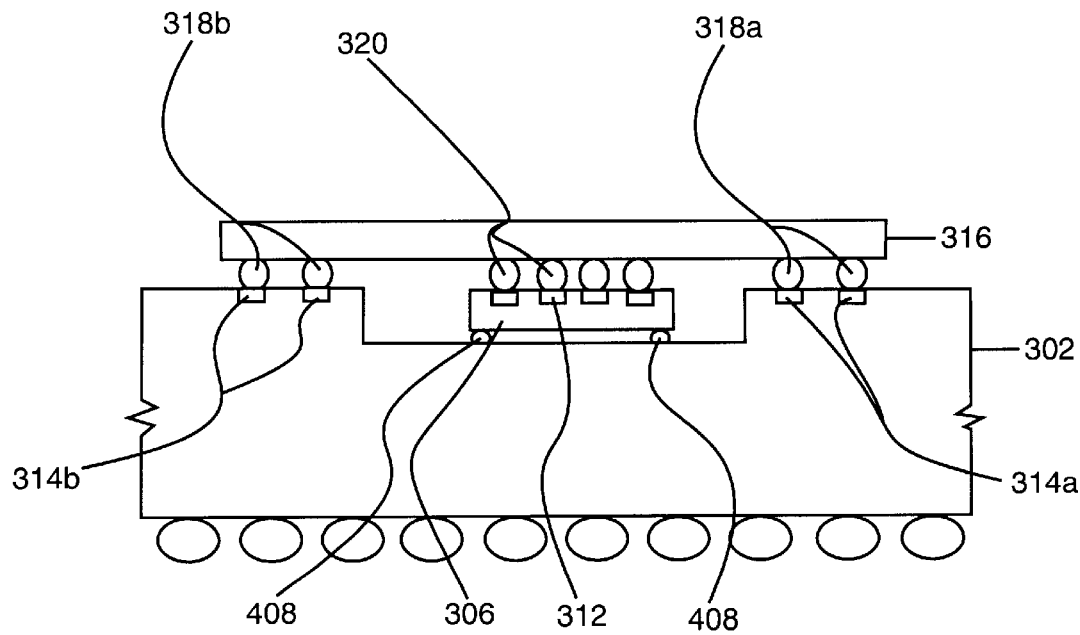
FIG. 4A illustrates a diagrammatic cross-section view of the second die attached to the first die and to the substrate with a die attach material in accordance with an alternative embodiment of the present invention.
Figure 4B:
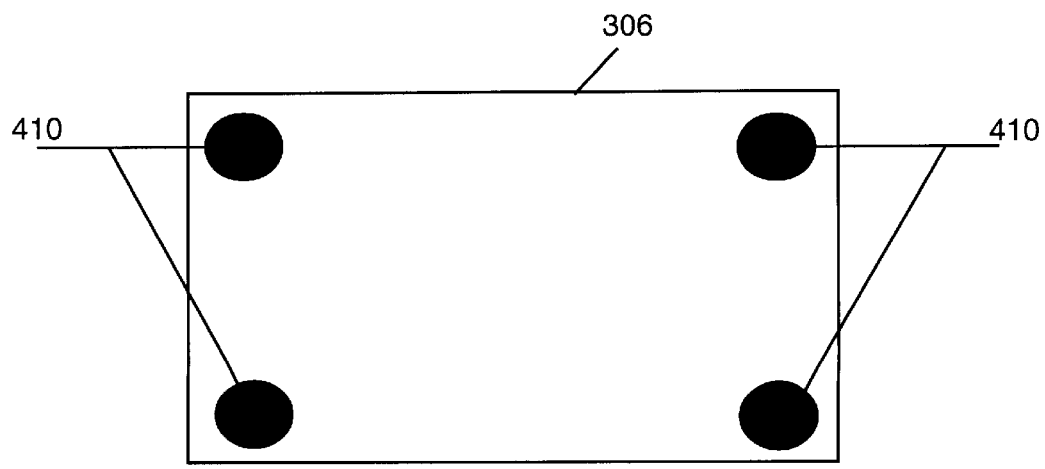
FIG. 4B illustrates a cross-section bottom view of a metallic coating configuration on a back surface of the first die in accordance with an alternative embodiment of the present invention.

An alternative configuration of a die attach material 408 and metallic coating configuration 410 that together promote self-alignment is illustrated in FIGS. 4A and 4B. FIG. 4A illustrates a diagrammatic cross-section view of the second die 316 attached to the first die 306 and to the substrate 302 with the die attach material 408 in accordance with an alternative embodiment of the present invention. FIG. 4B illustrates a cross-section bottom view of the metallic coating configuration 410 on a back surface of the first die 306 in accordance with an alternative embodiment of the present invention.

As shown in FIG. 4A, the die attach material 408 is in the form of solder material and is deposited at each corner of the back surface of the first die 306. Additionally, in this embodiment the first die 306 will include a metallic coating 410 (as shown in FIG. 4B) that is patterned to form bonds with the deposited solder material 408. The amount of solder material used for the die attach material 408 will be less than the solder material used for the first and second set of contacts of the second die 316. Thus, the second die's sets of contacts 318a and 318b and 320 will attract more strongly to the conductive landings 314a and 314b or I/O pads 312 than the first die's die attach material 408 to the substrate 302.

Alternatively, the first die 306 may have a small enough weight such that a die attach material 408 is not required between the first die 306 and the substrate 302. In this embodiment, the second set of contacts 320 of the second die 316 are attached to the I/O pads 312 of the first die 306, and the first and second die combination is then attached to the substrate 302 by coupling the first set of contacts 318a and 318b of the second die to the conductive landings 314a and 314b of the substrate 302.

Figure 5:
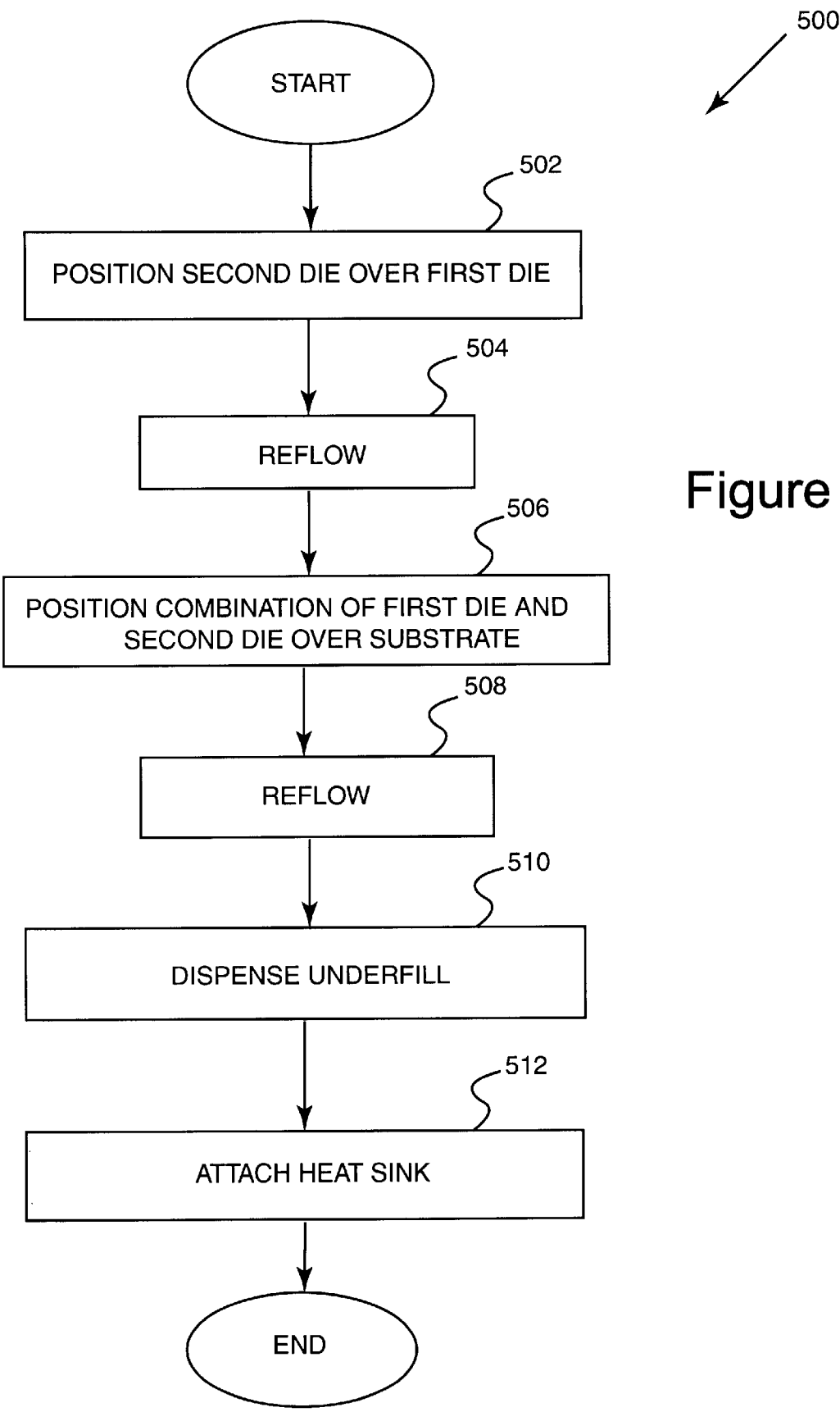
FIG. 5 is a flow chart illustrating a process of fabricating a chip-on-chip package in accordance with an alternative embodiment of the present invention.

FIG. 5 is a flow chart illustrating a process 500 of fabricating a chip-on-chip package in accordance with an alternative embodiment of the present invention. In contrast to the process 200 of FIG. 2, initially, the second die 316 is positioned over the first die 306 in operation 502 before the first die 306 and second die 315 are attached to the substrate 302. A first reflow process is then performed in operation 504 to securely attach the second die 316 to the first die 306. This allows the combined first and second dies to be moved by placement equipment without the dies coming apart. In other words, the combined first and second dies are preattached before they are placed on and attached to the substrate, for example.

Once the second die 316 is securely attached to the first die 106, the first and second die combination is then positioned over the substrate 302 in operation 506. A die attach material 308 is used between the first die 306 and the substrate, and the first set of contacts 318a and 318b of the second die 316 are mated with associated conductive landings 314a and 314b of the substrate 302.

A second reflow process is then performed in operation 508 to both attach the die stack to the substrate and to electrically connect at least one of the dies from the die stack to the substrate 302. More specifically, the second reflow process melts the die attach material 308 and bonds the first die 306 to the substrate 302, and the second reflow process melts the first set of contacts 314a and 314b of the first die 316 and bonds the second die 316 to the substrate 302.

The die attach material 308 and first and second set of contacts of the second die 316 may be formed from any suitable material. For example, the contacts and die attach material 308 may be formed from a solder material. By way of another example, the die attach material 308 may be formed from an adhesive epoxy. Of course, if the die attach material 308 is formed from a different material than the set of contacts, two separate reflow operations may be needed to adhere the combined first and second dies to the substrate 302. For example, one reflow operation and temperature may be used to adhere the second die's first set of contacts to the substrate 302, and another reflow operation and temperature may be used to adhere the combined first die 306 to the substrate 302.

An underfill layer may then be dispensed between the first and second die and substrate in operation 510. A heat sink 324 may also be attached to the bottom surface of the second die 316 in operation 512. The process 500 ends after completion of operation 512.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. For example, the die attach material between the first die and substrate and the sets of contacts of the second die may have different material compositions, such as compositions that have different reflow temperatures. Consequently, the separate reflow operations may require different reflow temperatures for attaching the first die to the second die and for attaching the combined first and second die to the substrate. Accordingly, the present embodiments are to be considered as illustrative and not restrictive, and the invention is not to be limited to the details given herein, but may be modified within the scope and equivalents of the appended claims.

What is claimed is:

1. A chip-on-chip integrated circuit package comprising:
   a substrate having a plurality of conductive landings disposed on a first surface thereof;
   a first die positioned over the substrate, the first die having a plurality of I/O pads that face away from the substrate; and a second die that is mounted on the first die, the second die including a first set of contacts that directly mate with the conductive landings on the substrate and a second set of contacts that mate with the I/O pads on the first die.

2. A chip-on-chip integrated circuit package as recited in claim 1, wherein the first set of contacts on the second die take the form of a first set of solder bumps; and the second set of contacts on the second die take the form of a second set of solder bumps.

3. A chip-on-chip integrated circuit package as recited in claim 1, wherein the substrate includes a cavity for receiving the first die.

4. A chip-on-chip integrated circuit package as recited in claim 1, wherein the first set of contacts are larger than the second set of contacts such that the second die is capable of being attached to the first die and substrate without the substrate having a cavity for receiving the first die.

5. A chip-on-chip integrated circuit package as recited in claim 1, wherein the substrate is a device selected from the group consisting of a ball grid array device, a pin grid array device, and a land grid array device and at least some of the conductive landings disposed on the first surface of the substrate are coupled with a plurality of substrate contacts that are in the form of one from the group consisting of external bumps, external pins, and external landing pads.

6. A chip-on-chip integrated circuit package as recited in claim 1, further comprising a heat sink on a surface of the second die that does not include the first and second set of contacts of the second die.

7. A chip-on-chip integrated circuit package as recited in claim 1, wherein a cavity region formed by the first die, the second die and the substrate is filled with an underfill material.

8. A chip-on-chip integrated circuit package as recited in claim 1, further comprising an encapsulating material for encapsulating the first and second dies.

9. A chip-on-chip integrated circuit package as recited in claim 2, wherein the second die is a device selected from the group consisting of a flip chip device, a surface mount device, a ball grid array device, and a pin grid array device.

10. A chip-on-chip integrated circuit package as recited in claim 2, wherein at least a portion of the solder bumps in the first and second sets of solder bumps have a substantially common reflow temperature.

11. A chip-on-chip integrated circuit package as recited in claim 2, further comprising a die attach material for attaching the first die to the substrate, wherein the die attach material and the first and second sets of solder bumps have a configuration that facilitates bonding.

12. A chip-on-chip integrated circuit package as recited in claim 11, wherein at least a portion of each of the solder bumps in the first and second sets of solder bumps and the die attach material have a substantially common reflow temperature.

13. A chip-on-chip integrated circuit package as recited in claim 12, wherein the portions of each of the solder bumps and the die attach material having a substantially common reflow temperature are formed from a eutectic solder material.

14. A chip-on-chip integrated circuit package as recited in claim 11, wherein the die attach material is a solder material and the first die includes a metallic coating that serves as a bonding surface for the die attach material.

15. A chip-on-chip integrated circuit package as recited in claim 14, wherein the metallic coating and die attach material are configured to promote self-alignment of the second die with respect to the first die and substrate.

16. A chip-on-chip integrated circuit package as recited in claim 15, wherein the die attach material has an amount that is less than the portions of the first and second set of contacts so as to promote self-alignment.

17. A chip-on-chip integrated circuit package comprising:

a substrate having first and second surfaces and including a plurality of conductive landings disposed on the first surface and a plurality of substrate contacts on the second surface;

a first die attached to the first surface of the substrate by a die attach material, the first die having a plurality of I/O pads that face away from the substrate; and a second die that is mounted on the first die, the second die including a first set of solder bumps that are attached to the conductive landings on the substrate and a second set of solder bumps that mate with the I/O pads on the first die, wherein the die attach material and at least a portion of the first set of solder bumps have substantially a same reflow temperature.

18. A chip-on-chip integrated circuit package as recited in claim 17, wherein the first die includes a metallic coating that faces the substrate and the die attach material is a solder based die attach material that adheres to the metallic coating.

19. A chip-on-chip integrated circuit package as recited in claim 17, wherein at least a portion of the second set of solder bumps has substantially the same reflow temperature.

* * * * *